United States Patent [19]

Duley et al.

[11] Patent Number: 4,471,289

[45] Date of Patent: Sep. 11, 1984

[54] SWITCHING POWER SUPPLY CIRCUIT

[75] Inventors: Raymond S. Duley, Spring Valley; Rudolf J. Schwarzer, Cincinnati, both of Ohio

[73] Assignee: NCR Corporation, Dayton, Ohio

[21] Appl. No.: 472,359

[22] Filed: Mar. 4, 1983

[51] Int. Cl.³ .............................................. G05F 1/58
[52] U.S. Cl. ...................................... 323/222; 363/21; 363/63
[58] Field of Search ....................... 323/222, 267, 271; 363/20, 21, 43, 124, 131, 135, 63

[56] References Cited

U.S. PATENT DOCUMENTS

| | | | |
|---|---|---|---|
| 3,223,915 | 12/1965 | Ryerson et al. | 321/18 |
| 4,016,461 | 4/1977 | Roland | 361/18 |
| 4,189,670 | 2/1980 | Tanahashi | 323/267 |
| 4,386,311 | 5/1983 | Bafaro | 323/271 |
| 4,413,224 | 11/1983 | Krupka et al. | 363/21 X |

OTHER PUBLICATIONS

"Transformerless Converter Supplies Inverted Output", Gilbert Bank, *Design Ideas,* EDN/EEE, Jul. 1, 1971.

*Primary Examiner*—William H. Shoop
*Attorney, Agent, or Firm*—J. T. Cavender; Casimer K. Salys; T. Rao Coca

[57] ABSTRACT

Disclosed is an essentially on-chip switching power supply circuit for generating from a single 5 volt power supply high positive and/or low negative voltages of the order of ±25 or more. The circuit consists of a pulse generator which alternately activates a positive rail voltage circuit and a negative rail voltage circuit. The positive/negative rail voltage circuit consists of a positive/negative electronic switch in series with a positive/negative voltage generator having an output terminal where the required positive/negative voltage output is generated. The positive/negative voltage generator consists of an inductor and output capacitor coupled together via a rectifying diode. Connected in the positive/negative circuit, in a feedback loop between the output terminal and the positive/negative switch, is a comparator for comparing a preselected fractional value of the voltage at the output terminal with a preselected reference voltage for generating a signal to discontinue the positive/negative voltage generation when the output voltage equals or exceeds the desired high positive/low negative voltage.

5 Claims, 4 Drawing Figures

SWITCHING POWER SUPPLY CIRCUIT

BACKGROUND OF THE INVENTION

This invention relates to a switching power supply circuit, and more particularly to a switching power supply circuit which is capable of converting a single 5 volt reference voltage to a high positive rail voltage (of the order of 25 volts or more) and/or a low negative rail voltage (of the order of −25 volts or less) for use in, for example, integrated circuits.

It is well-known that many integrated circuits require for their operation, in addition to a low primary voltage (e.g. of voltage +5 volts), multiple high positive and/or low negative rail voltages. Specifically, nonvolatile semiconductor memory devices such as an electrically erasable programmable read-only memory ($E^2$PROM) and non-volatile random access memory (NV RAM) typically require a 5 volt primary voltage for read access purposes and a ±25 volt rail voltages for programming (i.e. write and store, respectively) purposes. Hitherto, these voltage requirements have been met by means of multiple power supplies, one power supply for providing each of the required voltages. However, use of such multiple power supplies is disadvantageous not only from a cost standpoint but also since it necessitates insuring that each power supply satisfies the devices' stipulated operational limits. It is preferable that a nonvolatile memory device have a built-in or on-chip power supply that is capable of functioning by means of a single +5 volt power supply and generating the necessary high positive and low negative rail voltages for operation of the device.

One prior art technique of generating high positive and low negative voltages from a low voltage (+5 volt) source is by means of discrete transformer and series regulator circuits coupled to the low voltage source. However, due to their bulkiness, such transformer circuits are not suitable for integration on a chip. It may be possible to locate the transformer elements on a pc board and integrate the remainder of the circuit at the chip level. However, the transformers not only occupy a large area of the pc board but require manual insertion on the pc board which is not cost-effective. Another disadvantage of the transformer and series regulator circuits is that they generally dissipate a significant amount of energy, thereby rendering the circuit inefficient.

It is therefore an object of the present invention to provide an efficient solid-state switching power supply circuit which by utilizing a single +5 volt power supply is capable of generating rail voltages of up to ±25 volts.

Another object of this invention is to provide a switching power supply circuit that is conducive for integration on a chip except for a pair of inductors and a pair of capacitors which are relatively small in size (each element occupying approximately one square cm. area) and suitable for automated insertion on a pc board.

It is another object of this invention to provide a switching power supply circuit that utilizes a single pulse generator to drive both positive and negative rails, thereby minimizing the number of components (and therefore, chip real estate) required for the circuit.

These and other objects of the invention will be apparent from the following description.

SUMMARY OF THE INVENTION

The subject switching power supply circuit comprises a square wave pulse generator which activates a positive rail voltage circuit during one-half of the cycle and a negative rail voltage circuit during the other half. The positive and negative rail voltage circuits are almost symmetrical. The positive/negative rail voltage circuit consists of a positive/negative switching circuit in series with a positive/negative voltage generator having an output terminal where the required high positive/low negative voltage output is generated. The positive/negative voltage generator consists of an inductor and output storage capacitor coupled together via a rectifying diode. Connected in the positive/negative circuit, in a feedback loop between the output terminal and the positive/negative switching circuit, is a comparison circuit for comparing the voltage at the output terminal with a preselected reference voltage and generating a signal to discontinue the positive/negative voltage generation when the output voltage equals or exceeds the required high positive/low negative voltage.

In operation, the square wave generator turns the positive and negative switching circuits on and off alternately. Referring specifically to the positive rail voltage generation, when the positive switching circuit is turned on a current will flow through the inductor in the positive voltage generator circuit. When the positive switching circuit is turned off an instantaneous high positive voltage spike is produced at the inductor-diode junction of the positive switching circuit which forward biases the diode and causes the energy stored in the electromagnetic field of the inductor to be transferred (in the form of a D.C. voltage increment) to the output storage capacitor and thereby to the positive voltage output terminal. This energy transfer from the inductor to the capacitor will continue until the output voltage increases in steps to the desired maximum or limiting positive rail voltage.

When the desired maximum or limiting positive voltage has been attained at the positive voltage output terminal, the comparison circuit associated with the positive rail voltage circuit will sense this condition and generate a signal which deactivates the positive voltage switching circuit. As a result, no current will flow in the inductor and no further positive voltage generation at the output terminal will take place so long as the voltage at the positive output terminal is at the maximum or limiting value. The negative rail voltage generation occurs in similar fashion.

BRIEF DESCRIPTION OF THE DRAWINGS

FIG. 2, which is comprised of FIGS. 2A and 2B, is a schematic circuit diagram of an embodiment of the unit shown in FIG. 1.

DETAILED DESCRIPTION OF THE PREFERRED EMBODIMENT

Figure 1:
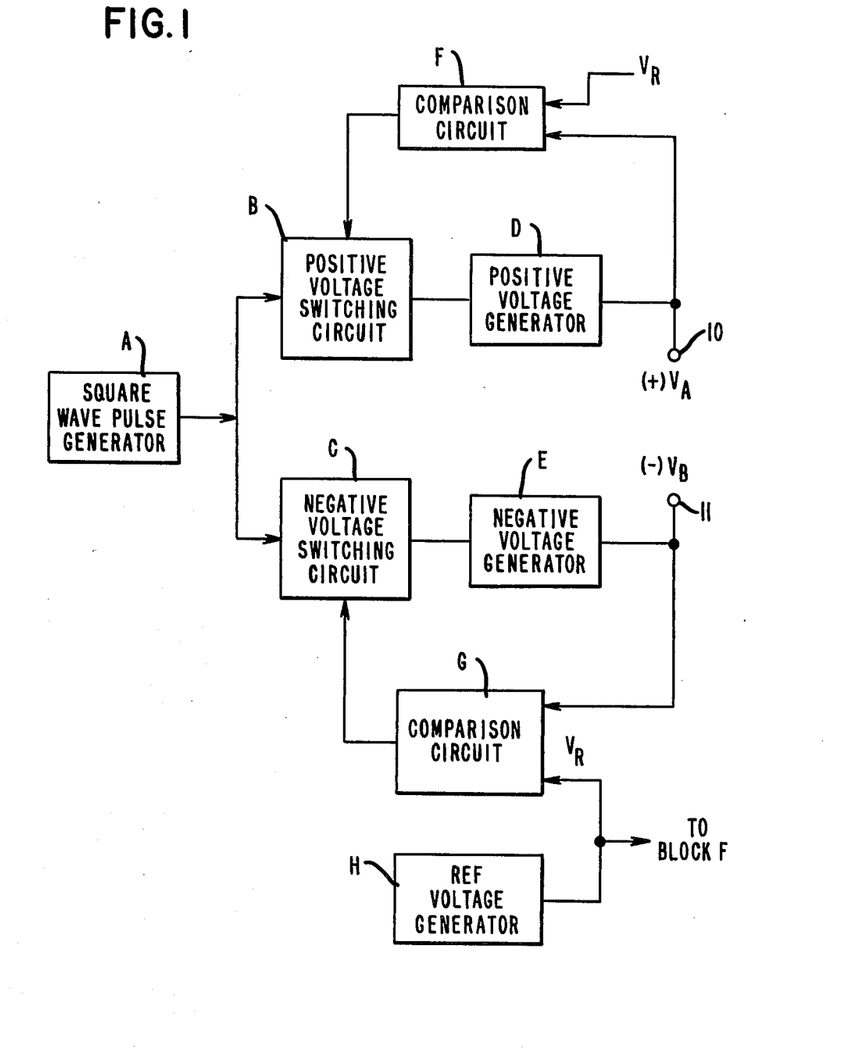
FIG. 1 is a block diagram with suitable headings of a switching power supply circuit embodying the principles of the present invention.
Figure 3:
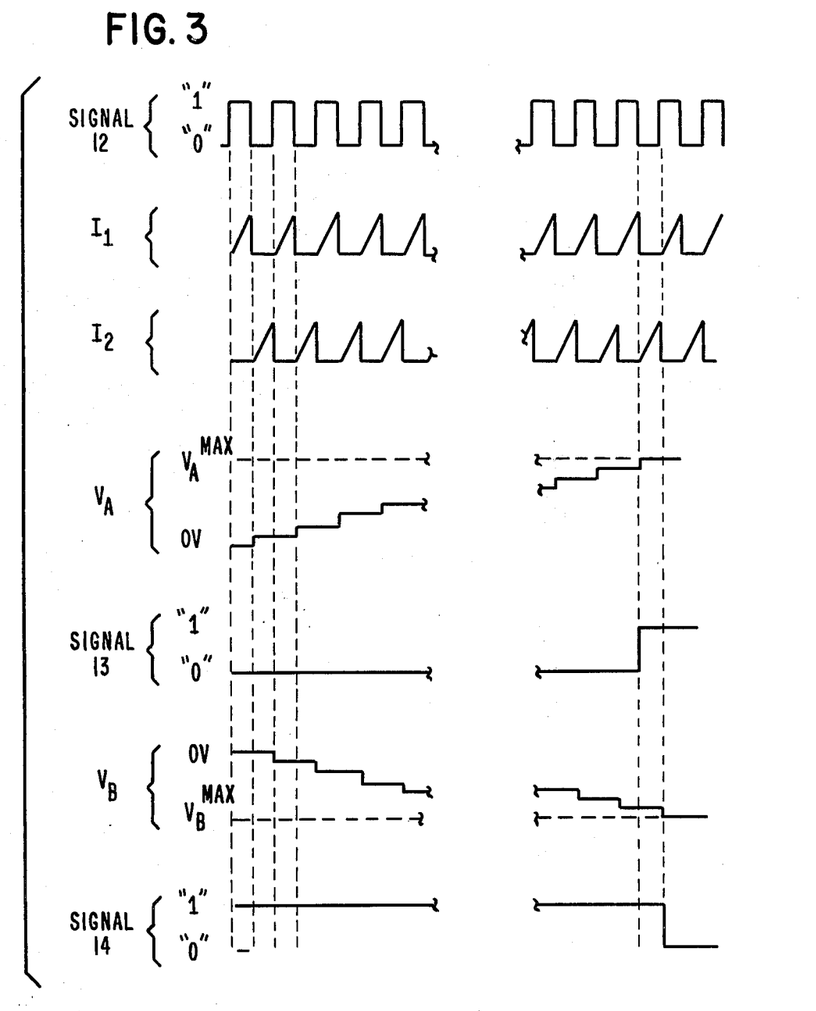
FIG. 3 is a signal diagram illustrating the operation of the circuit of FIG. 2.

FIG. 1 shows in block diagram representation a switching power supply circuit of the present invention. The circuit illustrated in FIG. 1 includes the square wave pulse generator designated by letter A which is activated by a 5 volt power supply. The square wave pulses generated by block A are typically of the type shown in FIG. 3 (designated as signal 12) having an amplitude of about 5 volts and a frequency of 1-10 KHz. The logic states "0" and "1" of signal 12 correspond to the minimum and maximum voltage values of the square wave pulses, respectively. Connected to the pulse generator A are a positive voltage switching circuit (PVSC) block B and a negative voltage switching circuit (NVSC) block C. Blocks B and C are essentially electronic switches, operated by 5 volt power supplies, which turn on or off the positive voltage generator (PVG) block D and the negative voltage generator (NVG) block E, respectively. The function of the positive voltage generator D is to generate a high positive voltage $V_A$ at the positive output terminal 10. Likewise, the function of the negative voltage generator D is to generate a low negative voltage $V_B$ at the negative output terminal 11. Output voltages $V_A$ and $V_B$, as shown in FIG. 3, are step functions having a frequency equal to the frequency of the square wave pulse (signal 12) of block A.

Connected between the positive output terminal 10 and PVSC block B, in a feedback loop, is a comparison circuit block F. Block F samples, by means of a built-in voltage divider, a fraction $\alpha$ of the positive output voltage $V_A$ and compares this fractional positive output voltage $V_A$ with a reference voltage $V_R$. A fractional value of $V_A$ is used for comparison purposes since the reference voltage $V_R$ is small, typically about 2.5 volts. Whenever $\alpha V_A$ is equal to or larger than $V_R$, block F generates a signal which turns off the PVSC block B, thereby stopping further high positive voltage generation by block D. In other words, the output of comparison circuit F commands the PVSC block B to become active or inactive depending on whether $\alpha V_A < V_R$ or $\alpha V_A \geq V_R$, respectively.

Likewise, the negative rail consists of the comparison circuit block G connected in a feedback loop between the negative output terminal 11 and NVSC block C. Comparison circuit G samples a fraction $\beta$ of the negative output voltage $V_B$ generated at terminal 11 and compares this fractional negative voltage $\beta V_B$ with the reference voltage $V_R$. When $\beta V_B \geq V_R$, circuit G commands the NVSC block C to turn off, thereby stopping further low negative voltage generation by block E. When $\beta V_B$ becomes less than $V_R$, the comparison circuit G senses this condition and commands NVSC block C to turn on, thereby enabling a buildup of voltage at output terminal 11 by the negative voltage generator block E.

As shown in FIG. 1, the reference voltage $V_R$ is generated by the reference voltage generator block H which is connected to comparison circuits G and H.

The details of construction of the various blocks shown in FIG. 1 will now be described with reference to FIG. 2 on a block-by-block basis.

Square Wave Pulse Generator (Block A)

The square wave generator block A is comprised of a timer $U_0$ for generating accurate time delays or oscillations. One example of timer $U_0$ is the LM555 integrated circuit chip sold by National Semiconductor Corporation. This part has eight pins, designated 1 through 8 in FIG. 2, and is capable of generating, in an astable mode, astable square waveforms. Pin 1 is connected to ground and pin 8 to a 5 volt power supply. Connected to timer $U_0$ are an external capacitor $C_1$ and two resistors $R_1$ and $R_2$. $C_1$ is connected between pins 1 and 2. $R_1$ is connected between pins 7 and 8 (the 5 volt power supply). $R_2$ is connected between pin 7 and the common connection of pins 2 and 6. The two external resistors $R_1$ and $R_2$ and capacitor $C_1$ control the free-running frequency and duty cycle of timer $U_0$ thereby enabling it to operate in an astable mode. Capacitor $C_2$, connected between pins 1 and 5 increases the stability of $U_0$. The astable waveforms are generated by $U_0$ at pin 3 or output node 12 and are as illustrated in FIG. 3 under the designation of signal 12.

Positive Voltage Switching Circuit (Block B)

The output of block A (i.e. signal 12) is applied to the PVSC block B via the current limiting resistor $R_4$. Resistor $R_4$, in turn, is connected to both the base of transistor $Q_4$ and collector of transistor $Q_3$. Transistors $Q_3$ and $Q_4$ are npn transistors of the 2N3904 variety. Emitters of $Q_3$ and $Q_4$ are connected to the ground. The base of transistor $Q_3$ is connected to a resistor $R_{17}$ which, in turn, is in connection with resistor $R_6$. The other side of $R_6$ is tied to a 5 volt power supply to provide the necessary current to the base of $Q_3$. The collector of transistor $Q_4$ establishes an electrical connection of block B with block D.

Positive Voltage Generator (Block D)

The positive voltage generator comprises an inductor $L_1$ one side of which is connected to a 5 volt power supply and the other side is connected to both the collector of transistor $Q_4$ (block B) and the anode of diode CR1. The cathode of CR1 is connected to the positive side of a storage (output) capacitor $C_3$ and to the positive output terminal 10. The other side of capacitor $C_3$ is connected to ground. It is essential that the cathode of CR1 be tied to the positive side of capacitor $C_3$ and the negative side of $C_3$ be grounded.

Comparison Circuit (Block F)

The output of block D is connected to resistors $R_{11}$ and $R_{16}$ in block F (in addition to the positive output terminal 10). The other side of $R_{11}$ is coupled to three components of block F: one side of a resistor $R_{12}$; the positive input of the comparator $U_1$; and one side of resistor $R_{14}$. The other side of $R_{12}$ is connected to ground. The combination of resistors $R_{11}$ and $R_{12}$ functions as a voltage divider for dividing the voltage $V_A$ generated at output terminal 10 into a value which will be suitable for comparison with reference voltage signal $V_R$ which is a low value, typically, of the order of 2.5 volts. A low value reference voltage $V_R$ is selected since it can be readily generated (by reference voltage generator block H) by utilizing a 5 volt power supply. Specifically, the voltage divider $R_{11}$–$R_{12}$ reduces the voltage $V_A$ to a fractional value given by $\alpha V_A$ where $\alpha = R_{12}/(R_{11}+R_{12})$. The second side of resistor $R_{16}$ is coupled to the anode of a diode CR5 and to one side of a resistor $R_{15}$. The second side of $R_{15}$ is maintained at ground potential. The cathode of diode CR5 is coupled to the cathode of CR4 and to the common connection of the positive input voltage terminal of comparator $U_1$ and the +5 volt power supply. The anode of diode CR4 is connected to a 5 volt power supply.

The output of comparator $U_1$, which is designated as signal 13, is connected to the following elements: the connecting point of resistors $R_6$ and $R_{17}$ (block B); and the cathode of diode CR6. The anode of diode CR6 is coupled to resistor $R_{14}$. The other side of $R_{14}$ is connected to the positive input of comparator $U_1$. The elements CR6 and $R_{14}$, which form a feedback path for comparator $U_1$, provide a positive hysteresis to comparator $U_1$.

Negative Voltage Switching Circuit (Block C)

The output of pulse generator block A (i.e. signal 12) is connected, in addition to the PVSC block B via the current limiting resistor $R_4$ to the NVSC block C via resistor $R_3$. The other side of $R_3$ is tied to the base of transistor $Q_1$, the emitter of which is tied to ground and its collector connected to three elements: resistor $R_5$; the base of transistor $Q_2$; and the output of comparator $U_2$ (contained in block G). The second side of resistor $R_5$ is connected to the 5 volt power supply. The emitter of transistor $Q_2$, like the emitter of $Q_1$, is connected to the ground and its collector is coupled to resistor $R_8$ which in turn is connected to the base of transistor $Q_5$ and resistor $R_7$. The other side of resistor $R_7$ and the emitter of $Q_5$ are connected to the 5 volt power supply. The collector of $Q_5$ contains the output of block C. Transistors $Q_1$ and $Q_2$ are standard npn transistors of the 2N3904 type and transistor $Q_5$ is a pnp transistor of the 2N3906 type.

Negative Voltage Generator (Block E)

Figure 2A:
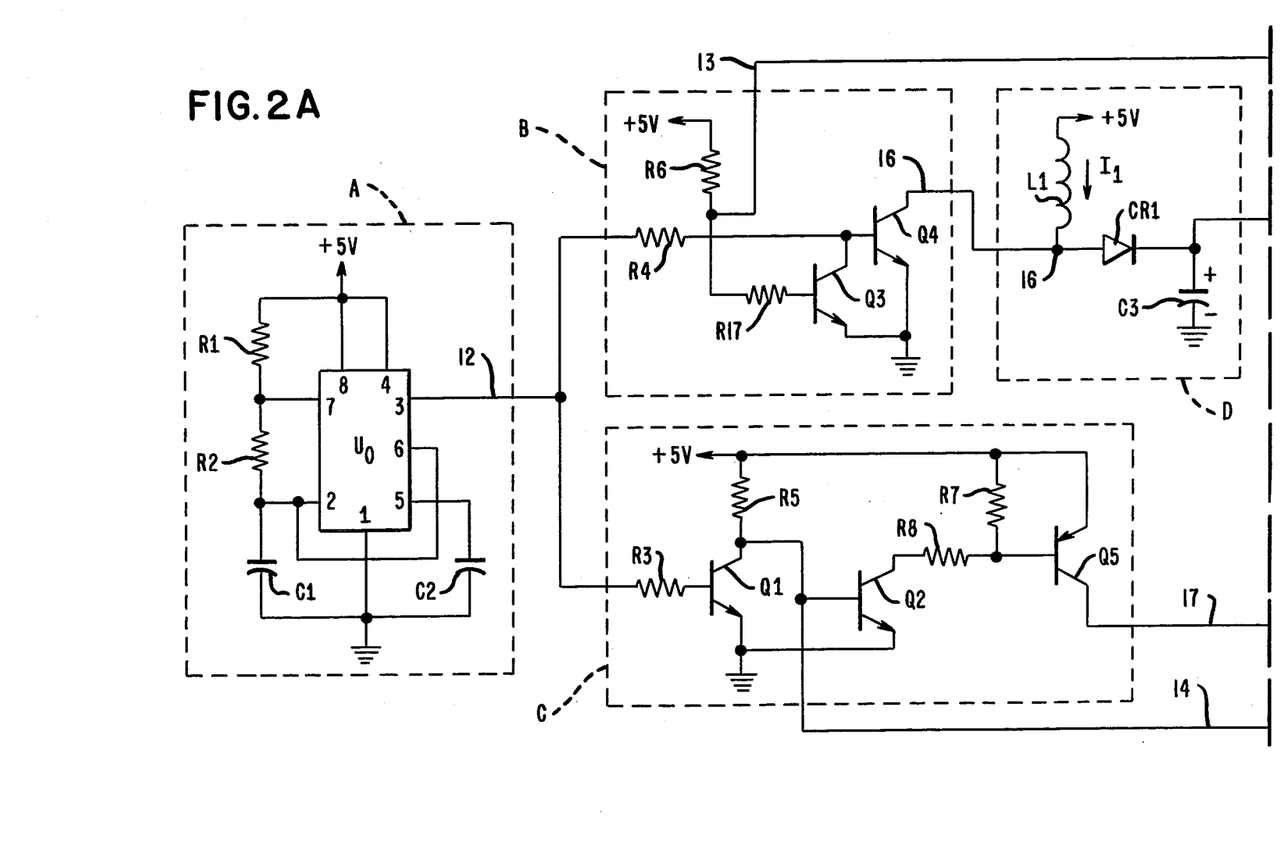
Figure 2B:
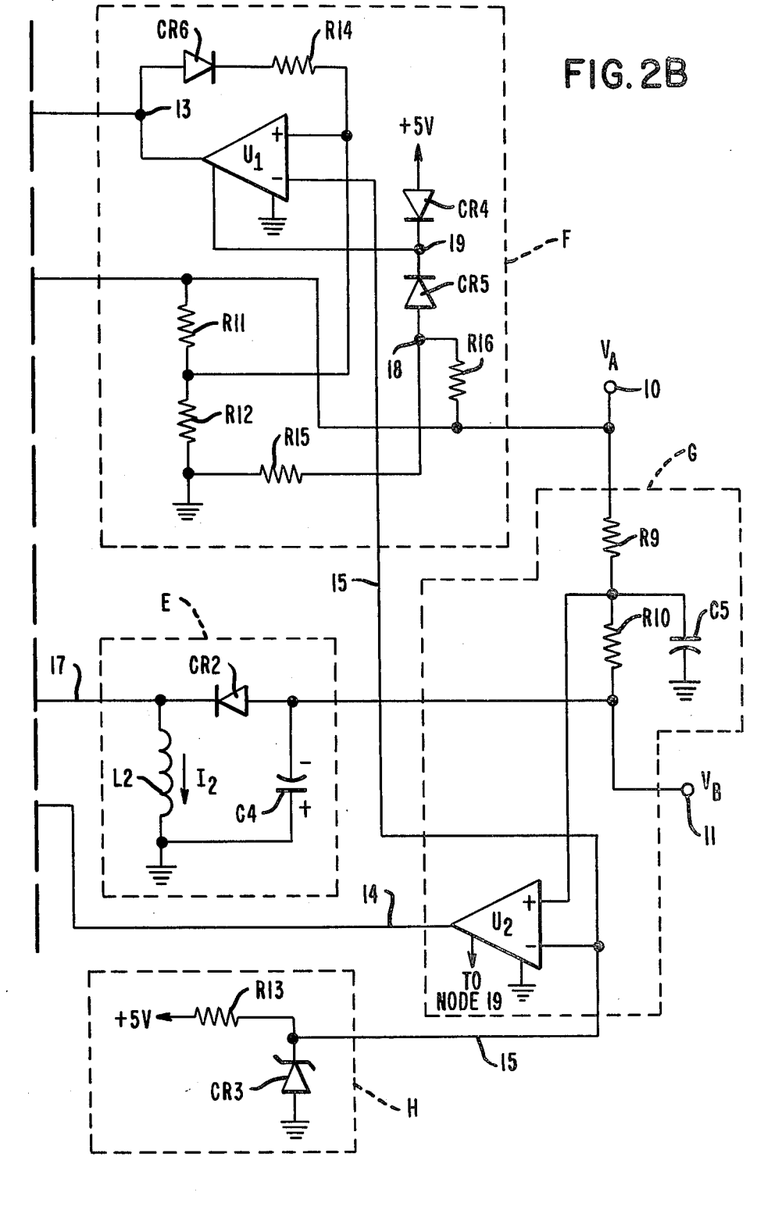

The negative voltage generator block E comprises an inductor $L_2$, a diode CR2 and storage capacitor $C_4$ connected as shown in FIG. 2B. The output of block C is connected to the cathode of diode CR2 and one side of inductor $L_2$. The other side of $L_2$ is tied to ground. The anode of diode CR2 is coupled to three points: the negative side of storage capacitor $C_4$ (the positive side of which is maintained at ground potential); the negative voltage output terminal 11; and resistor $R_{10}$ of block G.

Comparison Circuit (Block G)

This block consists of a voltage divider $R_9$ and $R_{10}$, comparator $U_2$ and capacitor $C_5$ connected as shown in FIG. 2B. As previously indicated, one side of resistor $R_{10}$ is connected to the negative voltage output terminal 11 and the common point of the negative side of capacitor $C_4$ and anode of diode CR2 (the latter two being contained in block E). The second side of resistor $R_{10}$ is connected to three places: the positive side of capacitor $C_5$ (the negative side of which is always maintained at ground potential); one side of resistor $R_9$ (the other side of $R_9$ being, as previously mentioned, connected to the positive voltage output terminal 10); and the positive (or non-inverting) input terminal of comparator $U_2$. The negative (or inverting) input terminal of $U_2$ is connected to the positive (or non-inverting) input terminal of comparator $U_1$ (block E) as well as to reference voltage generator block H. The output of comparator $U_2$ which is designated as signal 14, is coupled to the common connecting point of the collector of transistor $Q_1$, the base of transistor $Q_2$ and resistor $R_5$.

The combination of resistors $R_9$ and $R_{10}$ serves as a voltage divider for dividing the voltage $V_B$ generated at the negative voltage output terminal 11 into a value which will be suitable for comparison with reference voltage $V_R$ which is a low value, typically, about 2.5 volts. The voltage divider $R_9$–$R_{10}$ reduces the output voltage $V_B$ to a fractional value given by $\beta V_B$ where $\beta = R_9/(R_9 + R_{10})$.

Comparator $U_2$ is typically contained in the same package as comparator $U_1$ and will share the positive and negative power supply pins which are +5 volts and ground, respectively. A suitable comparator pair package is Part No. LM339 sold by National Semiconductor Corporation.

Reference Voltage Generator (Block H)

This block consists of the current limiting resistor $R_{13}$, one side of which is connected to the 5 volt power supply and the other side connected to the cathode of a zener reference diode CR3. The zener diode CR3 is typically a pair of series-connected LM385 elements having a stable and accurate reference voltage of about 2.5 volts. The anode of diode CR3 is maintained at ground potential. The reference voltage signal designated as signal 15 is FIG. 2 is generated at the connecting node of resistor $R_{13}$ and diode CR3.

Mode of Operation

Having described the configuration of the switching power supply circuit, operation of this circuit will now be traced. Referring to FIGS. 2 and 3, when the square wave generator signal 12 switches from a logic "0" to a logic "1" state, a current will flow in resistor $R_4$. This current will cause transistor $Q_4$ to conduct by allowing a current to flow from the collector to emitter of $Q_4$. Transistor $Q_3$ is held in an off state by signal 13 (logic "0" state) and will not conduct at this time. When transistor $Q_4$ is turned on in this manner, a current $I_1$ will flow in inductor $L_1$ in the direction shown in FIG. 2. At this point in time, diode CR1 is in a non-conducting state. Current $I_1$ will gradually build up until it reaches a dc maximum value as shown in FIG. 3. This maximum value is reached when inductor $L_1$ attains a state of saturation. Before this happens the square wave generator signal 12 changes from a logic "1" state to logic "0" state. This transition of the square wave generator block A causes transistor $Q_4$ to turn off. When $Q_4$ is turned off in this manner, the energy stored in the electromagnetic field of inductor $L_1$ will appear as an instantaneous positive high voltage spike at node 16. The amplitude of this pulse is typically greater than about 30 volts if the output storage capacitor $C_3$ were not present. This voltage spike forward biases diode CR1 and transfers the energy to storage capacitor $C_3$, thereby charging the capacitor to a positive voltage increment $V_A$ as illustrated in FIG. 3. Note, the voltage across the capacitor $C_3$ is the same as the voltage at output terminal 10. This process of charging the storage capacitor $C_3$ takes place whenever the square wave pulse 12 goes from logic "0" to logic "1" states, thereby increasing the voltage $V_A$ at output terminal 10 in steps until the desired maximum or limiting value $V_A^{max}$ has been reached.

The comparator $U_1$ continuously samples the voltage $V_A$ at terminal 10 via the voltage divider $R_{11}$–$R_{12}$ and compares the fractional value $\alpha V_A$ with the reference signal $V_R$. When $\alpha V_A < V_R$ i.e., when $V_A < V_A^{max}$, comparator $U_1$ will generate an output signal 13 having logic "0" as shown in FIG. 3. When $V_A$ reaches its positive voltage limit $V_A^{max}$, then the voltage signal at the non-inverting input of $U_1$ exceeds the voltage signal at its inverting input. This state of affairs causes comparator $U_1$ to switch signal 13 from logic "0" state to logic "1" state.

Since when the output signal 13 of comparator $U_1$ changes from logic "0" state to logic "1" state, it is indicative of the fact that the output terminal 10 has attained its full potential (i.e., $V_A$ reached its limiting value) no further charging of storage capacitor $C_3$ will take place as discussed below. The output (logic "1" state) of $U_1$ will now turn on transistor $Q_3$. As a result, the base of transistor $Q_4$ will be connected to ground, thereby rendering $Q_4$ non-conducting. Since signal 13, so long as it is in the logic state "1" holds transistor $Q_4$ is an off state, any transitions made by signal 12 from logic "0" to logic "1" state will not have an effect on transistor $Q_4$. Signal 12 which is applied to the base of transistor $Q_4$ via resistor $R_4$ will go to ground via transistor $Q_3$. In other words, $Q_4$ will remain in the turned off state and will not permit current $I_1$ to flow in inductor $L_1$ for building up energy therein. This is an advantageous feature of the present invention since, for example, if the load connected to output terminal 10 were a MOS integrated circuit, the discharge time of output $V_A$ will be very long. During this long time, the output $V_A$ will be maintained at $V_A^{max}$ by the output storage capacitor $C_3$ and current $I_1$ is not drawn by inductor $L_1$ thereby making the subject switching power supply circuit very energy efficient.

When the positive output voltage $V_A$ at terminal 10 falls below the limiting value $V_A^{max}$, the positive voltage switching circuit block B will be turned on as follows. The comparator $U_1$ output signal 13 will now make a transition to logic "0" state. This signal 13, which is applied to transistor $Q_3$ via resistor $R_{17}$, will turn off transistor $Q_3$ which, in turn, allows signal 12 to turn transistor $Q_4$ on. Once $Q_4$ is in the conducting state, a current $I_1$ will flow in inductor $L_1$ whenever signal 12 (applied to base of $Q_4$ via resistor $R_4$) is in logic state "1". The remainder of the high positive voltage generation process will take place as previously explained, thereby once again raising the voltage at terminal 10 to the limiting value.

The operation of the negative rail voltage circuit comprising of blocks C, E and G is similar to the operation of the positive rail voltage circuit comprising of blocks B, D and F traced above. When pulse generator $U_0$ output signal 12 goes from a logic "1" state to logic "0" state the NVSC block C will be activated. In other words, during one-half cycle of signal 12 the positive rail voltage circuit is in operation and in the second half-cycle the negative rail voltage circuit is in operation. This reduces the peak current requirement of the subject switching power supply circuit to one-half of what it would be if both the positive and negative rail voltage circuits (specifically, if both inductors $L_1$ and $L_2$) were conducting simultaneously. When signal 12 is in logic "1" state, transistor $Q_1$ is turned on and therefore transistors $Q_2$ and $Q_5$ are both turned off. Note, $Q_2$ and $Q_5$ work in unison, i.e., they are both either on or off at any given time. When signal 12 goes from logic "1" state to logic "0" state, it turns transistor $Q_1$ off. This enables the current to flow from the 5 volt power supply connected to resistor $R_5$, via $R_5$, to the base of $Q_2$, thereby turning $Q_2$ on. This causes $Q_2$ to turn on and permit a current $I_2$ to flow from the emitter of $Q_5$ to the collector of $Q_5$. Current $I_2$ flows through inductor $L_2$ and eventually to ground. Current $I_2$ gradually builds up to a maximum value as illustrated in FIG. 3.

When the current in inductor $L_2$ reaches the dc maximum state, signal 12 makes a transition from logic "0" to logic "1". This causes transistor $Q_1$ to turn on and bring the base of $Q_2$ to ground potential. As a result, $Q_2$ and $Q_5$ are both abruptly turned off, thereby not only interrupting the flow of current $I_2$ but also generating an instantaneous high negative voltage spike at node 17. Due to its sufficiently large amplitude, the voltage spike at 17 will forward bias the diode CR2 and transfer the energy stored in the electromagnetic field of inductor $L_2$ to storage capacitor $C_4$. The energy transferred to $C_4$ in this manner will appear as a voltage signal $V_B$ at the negative output terminal 11 (see FIG. 3).

In this manner, the negative voltage output $V_B$ will gradually build up as a step-function as illustrated in FIG. 3 until $V_B$ reaches the desired maximum or limiting value $V_B^{max}$. Throughout this negative voltage generation process, comparator $U_2$ is continuously comparing $V_B$, by means of voltage divider $R_9$-$R_{10}$ with reference voltage signal $V_R$ and generating an output signal 14 having a logic "1" state. When $V_B \geq V_B^{max}$, comparator $U_2$ will sense the state of affairs at output terminal 11 and will cause the output signal 14 to switch from logic "1" to logic "0". This transition of signal 14 will cause transistor $Q_2$ to be clamped off. Consequently, the negative voltage rail circuit will be in a high impedance or off state until $V_B$ falls below $V_B^{max}$. When this state of affairs is reached, the comparator $U_2$ output signal 14 will switch from logic "0" back to logic "1" restarting the negative voltage generation process as previously described.

The reference voltage generator block H generates a reference voltage $V_R$ by utilizing a current limiting resistor $R_{13}$ connected to a 5 volt power supply in series with zener diode CR3. The resistor $R_{13}$ not only maintains the current in zener CR3 below the zener breakdown point, but also determines the magnitude of the reference voltage signal $V_R$. The magnitude of $V_R$ is selected to lie approximately midway between the ground potential and the 5 volt power supply that is used since comparator $U_1$ and $U_2$, which are also connected to a 5 volt power supply and ground connection, will have the least amount of offset at this voltage setting.

Once a reference voltage $V_R$ has been selected for comparison purposes, the voltage dividers $R_9$-$R_{10}$ and $R_{11}$-$R_{12}$ are designed (i.e. the values $\alpha$ and $\beta$ are chosen) such that, in the acquiescent state of the circuit, the voltages at the non-inverting inputs of comparators $U_1$ and $U_2$ are approximately the same as the reference voltage $V_R$. Such an adjustment of voltages $V_A$ and $V_B$ by voltage dividers $R_{11}$-$R_{12}$ and $R_9$-$R_{10}$, respectively, will enable comparators $U_1$ and $U_2$ to detect even the smallest departure from $V_R$ and appropriately control the voltage generation process in the positive and negative rails.

Voltage divider $R_{15}$-$R_{16}$ is included in the circuit of FIG. 2 for providing the necessary bias voltage to comparators $U_1$ and $U_2$ by making use of the voltage $V_A$ generated at terminal 10. When the power supply voltage (+5 volts) is turned on, the current necessary for the operation of comparators $U_1$ and $U_2$ flows from the power supply through the diode CR4. When $V_A$ (at terminal 10) reaches its maximum value, the voltage divider $R_{15}$-$R_{16}$ will cause the voltage at node 18 (i.e. the junction of resistor $R_{16}$ and the anode of the forward biased diode CR5, see FIG. 2) to be equal to the power supply voltage. As a result, the current necessary for the operation of comparators $U_1$ and $U_2$ will flow from the positive output voltage terminal 10 through the diode CR5 rather than the +5 volt power supply. The combination of elements $R_{15}$ and $R_{16}$ in conjunction with diode CR5 will also prevent a noise pulse, which could deleteriously affect the load connected to terminal 10, from being generated when the +5 volt power supply is turned off.

The values of the various circuit elements indicated in FIG. 2 of the drawings depends on the particular application of this invention. For example, for generating output voltages $V_A$ and $V_B$ of ±22 volts, respectively, by utilizing a +5 volt power supply, inductors $L_1$ and $L_2$ should be each about 100 millihenrys and the capacitances of storage capacitors $C_3$ and $C_4$, which are dictated by the output current requirements, should be about 1 to 10 microfarads. The various resistors constituting the PVSC block B and NVSC block C are selected such that the transistors with which they are connected have a gain of about 10. In other words, the resistors which control the base current and collector current of a transistor should be such that the gain of the transistor is about 10 since at this gain setting the transistors have a specification maximum saturation voltage from collector to emitter. The values of resistors $R_9$, $R_{10}$, $R_{11}$, $R_{12}$, $R_{15}$ and $R_{16}$ are determined by the requirements of the various voltage dividers that these elements constitute.

Thus, there has been described a switching power supply circuit which is capable of generating high positive (of up to 25 volts or more) and low negative (of down to $-25$ volts or less) voltages by utilizing a $+5$ volt power supply. The circuit is conducive for integration on a chip except for four elements—capacitors $C_3$ and $C_4$ and inductors $L_1$ and $L_2$. These elements are relatively small in size and are suitable for easy, automated insertion on a PC board and connected to the IC chip constituting the remainder of the circuit. The above switching power supply circuit has the advantage of saving valuable area on the chip due to its utilization of a single pulse generator (block A) to drive both the positive and negative rail voltage circuits alternately. Also, the circuit is energy-efficient since once the necessary voltage limits have been attained by the positive and negative voltage generation blocks D and E, respectively, (i.e., the circuit is in an acquiescent state) these blocks are turned off by switching circuit blocks B and C, respectively, thereby stopping further consumption of power. Yet another advantage of this circuit is that it utilizes a single reference voltage generator H for generating the reference voltage signal necessary for comparison purposes in both the positive and negative rail circuits.

It is apparent from the foregoing specification, the present invention is susceptible of various modifications and alterations which differ particularly from the embodiment described in the preceding specification and drawings. For this reason, it is to be understood that all the foregoing is intended to be merely illustrative and not to be construed as being restrictive or otherwise limiting of the present invention, excepting as is set forth in the appended claims.

We claim:

1. A switching power supply circuit having a first and second output terminal for generating thereat high positive and low negative D.C. voltages, respectively, from a low positive D.C. voltage power supply, said circuit comprising:
   a pulse generator connected to said power supply for generating square wave pulses at a substantially constant repetition rate;
   a positive voltage switching circuit connected to said pulse generator, said positive voltage switching circuit being turned on or off in response to said pulses;
   a positive voltage generator circuit connected between the positive voltage switching circuit and the first output terminal for producing the high positive D.C. voltage;
   a positive voltage comparison circuit connected between the first output terminal and the positive voltage switching circuit for continuously comparing a fractional value of said high positive voltage with a reference voltage signal and generating a control signal for turning off the positive voltage switching circuit when said fractional value of the high positive voltage equals or exceeds the reference signal;
   a negative voltage switching circuit connected to said pulse generator, said negative voltage switching circuit being turned on or off in response to said pulses;
   a negative voltage generator circuit connected between the negative voltage switching circuit and the second output terminal for producing the low negative D.C. voltage; and
   a negative voltage comparison circuit connected between the second output terminal and the negative voltage switching circuit for continuously comparing a fractional value of said low negative voltage with said reference voltage signal and generating a control signal for turning off the negative voltage switching circuit when said fractional value of the low negative voltage equals or exceeds the reference signal.

2. The circuit as in claim 1 wherein the positive voltage generator circuit comprises a first inductor, a first diode and a first output storage capacitor connected to said low D.C. voltage power supply such that a current buildup occurs in said first inductor when the positive voltage switching circuit is turned on and said first inductor current is converted to a high positive D.C. voltage and stored in said first output storage capacitor when said positive voltage switching circuit is turned off and the negative voltage generator circuit comprises a second inductor, a second diode and a second output storage capacitor connected to said low D.C. voltage power supply such that a current buildup occurs in said second inductor when the negative voltage switching circuit is turned on and said second inductor current is converted to a low negative D.C. voltage and stored in said second output storage capacitor when said negative voltage switching circuit is turned off.

3. The circuit as in claim 2 wherein said fractional values of the high positive voltage and low negative voltage are produced by voltaged divider circuits coupled to said first and second output terminals, respectively.

4. An essentially integrated switching power supply circuit having a first and second output terminal for generating thereat high positive and low negative D.C. voltages, respectively, by utilizing a low positive D.C. voltage power supply, said circuit comprising:
   a pulse generator connected to said power supply for generating square wave pulses at a substantially constant repetition rate;
   a first switching circuit connected to the pulse generator, said switching circuit being turned on or off in response to said pulses;
   a first voltage generator circuit having a first inductor, one side of said first inductor being connected to said low voltage power supply and the other side of the first inductor being connected to said first switching circuit and to the anode of a first diode, the cathode of the first diode being connected to the positive side of a first output storage capacitor and to said first output terminal, the negative side of said first capacitor being connected to ground potential;
   a first comparison circuit connected between the first output terminal and said first switching circuit for continuously comparing a fractional value of said high positive voltage with a reference voltage signal and producing a first control signal for turning off said first switching circuit when said fractional value of the high positive voltage equals or exceeds the reference voltage;

a second switching circuit connected to the pulse generator, said second switching circuit being turned on or off in response to said pulses;

a second voltage generator circuit having a second inductor, one side of said second inductor being connected to said second switching circuit and to the cathode of a second diode, the anode of the second diode being connected to the negative side of a second storage capacitor, the positive side of said second storage capacitor and the second side of the second inductor being connected to ground potential;

a second comparison circuit connected between the second output terminal and said second switching circuit for continuously comparing a fractional value of said low negative voltage with said reference voltage signal and producing a second control signal for turning off said second switching circuit when said fractional value of the low negative voltage equals or exceeds the reference voltage; and a reference voltage generator for generating said reference signal.

5. The switching power supply circuit as recited in claim 4 wherein said fractional value of the high positive voltage being produced by a first voltage divider and said fractional value of the low negative voltage being produced by a second voltage divider.

* * * * *